United States Patent
Gau et al.

(10) Patent No.: US 9,966,547 B2
(45) Date of Patent: May 8, 2018

(54) ORGANIC SOLAR CELL HAVING SURFACE HETEROJUNCTIONS ACTIVE LAYER AND METHOD FOR MANUFACTURING THE SAME

(71) Applicant: NATIONAL CHENG KUNG UNIVERSITY, Tainan (TW)

(72) Inventors: Chie Gau, Tainan (TW); Yu-Shun Cheng, Tainan (TW); Yu-Cheng Hong, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days. days.

(21) Appl. No.: 14/859,534

(22) Filed: Sep. 21, 2015

(65) Prior Publication Data
US 2016/0149148 A1    May 26, 2016

(30) Foreign Application Priority Data
Nov. 24, 2014 (TW) .............................. 103140687 A (51) Int. Cl.
*H01L 31/00* (2006.01)
*H01L 51/42* (2006.01)
*H01L 51/00* (2006.01)

(52) U.S. Cl.
CPC ...... *H01L 51/4253* (2013.01); *H01L 51/0003* (2013.01); *H01L 51/0036* (2013.01); *H01L 51/0047* (2013.01); *Y02E 10/549* (2013.01); *Y02P 70/521* (2015.11)

(58) Field of Classification Search
CPC ............. H01L 51/4253; H01L 51/0003; H01L 51/0036
See application file for complete search history.

(56) References Cited

PUBLICATIONS

Chen et al., Morphological study of P3HT:PCBM blend films prepared through solvent annealing for solar cell applications, Solar Energy Materials & Solar Cells 94 (2010) 2426-2430.*
Kang TE et al., Abstract of "Photoinduced charge transfer in donor-acceptor (DA) copolymer: fullerene bis-adduct polymer solar cells," https://www.ncbi.nlm.nih.gov/pubmed/23289501, Published online Jan. 25, 2013.

(Continued)

*Primary Examiner* — Shannon Gardner
(74) *Attorney, Agent, or Firm* — CKC & Partner Co., Ltd.

(57) ABSTRACT

The invention relates to an organic solar cell having surface heterojunctions active layer and a method for manufacturing the same. The organic solar cell comprises a glass substrate, a first electrode, a first transmission layer, an active layer, a second transmission layer and a second electrode. The first electrode is formed on the glass substrate. The first transmission layer is formed on the first electrode. The active layer is deposited on the first transmission layer. The second transmission layer is formed on the active layer, and the second electrode is formed on the second transmission layer. The active layer comprises a donor layer and a plurality of acceptor particles partially embedded in a surface of the donor layer. By hydrophobic phenomenon occurred among the donor layer and the acceptors, the interface enables to be increased to transfer the electron and hole without obstacles for promoting the efficiency of the organic solar cell.

11 Claims, 6 Drawing Sheets

(56) References Cited

PUBLICATIONS

Elif Alturk Parlak et al., Abstract of "Efficiency improvement of PCDTBT solar cells with silver nanoparticles," http://www.sciencedirect.com/science/article/pii/S0927024812005326, available online Dec. 27, 2012.

Tamai Y et al., Abstract of "Charge-carrier generation in organic solar cells using crystalline donor polymers," https://www.ncbi.nlm.nih.gov/pubmed/24980903, Published online Jun. 30, 2014.

Hae Jung Son et al., Abstract of "Synthesis of Fluorinated Polythienothiophene-co-benzodithiophenes and Effect of Fluorination on the Photovoltaic Properties," http://pubs.acs.org/doi/abs/10.1021/ja108601g?journalCode=jacsat&quickLinkVolume=133&quickLinkPage=1885&selectedTab=citation&volume=133, Published online Jan. 25, 2011.

J. Peet et al., "Efficiency enhancement in low-bandgap polymer solar cells by processing with alkane dithiols," Nature Materials, 4 pages, May 27, 2007.

Bingbing Chen et al., Abstract of "Effects of bulk and interfacial charge accumulation on fill factor in organic solar cells," http://aip.scitation.org/doi/abs/10.1063/1.4805053, Published online May 2013.

\* cited by examiner

ORGANIC SOLAR CELL HAVING SURFACE HETEROJUNCTIONS ACTIVE LAYER AND METHOD FOR MANUFACTURING THE SAME

BACKGROUND OF THE INVENTION

1. Fields of the Invention

The present invention relates to an organic solar cell having a plurality of surface heterojunctions active layer and a method for manufacturing the same by forming and partially embedding a plurality of nanostructured particles are acceptors in a donor layer due to the hydrophobic phenomenon occurred among the donor layer and the nanostructured particle acceptors. In such as case, the interface between the donor and acceptor enables to be increased to transfer the electron and hole without obstacles for promoting the efficiency of the organic solar cell.

2. Descriptions of Related Art

The sun is the source of life, and human being cannot live without the sun. Although there are no immediately exhausted crises for the fossil fuels, e.g. oil or coal, on which the life around the world rely, the carbon dioxide emission from the excessive use of the fossil fuel has already caused the serious greenhouse effect to become the culprit in the earth's warming temperatures. Furthermore, since the price of crude oil continued to rise in recent years and nuclear power plant safety concern, looking for alternative energy sources has become imperative. Alternative energy sources, such as wind, hydro, geothermal, biodiesel, solar cells and so on, to be called as green energy, have attracted considerable attention over recent years, among which the solar cell is the most promising due to its high theoretical efficiency and mature technology.

The solar cell can transform the solar energy into electrical energy based on the photoelectric effect of materials. The photoelectric effect is the phenomenon that light shines into the material to increase conductive carriers. In terms of the semiconductor materials, as the energy of the light is larger than the energy gap of the semiconductors, the free elector-hole pairs are generated in the interior. However, these elector-hole pairs can be recombined soon or captured by the carriers in the semiconductors to become vanished. If an internal electric field is applied at this time, the carriers will be quickly led out before vanished. The internal electric field is generated in the joint interface between p-type and n-type semiconductors, and a so-called solar cell uses the internal electric field to extract effectively the current to induce the electricity.

According to the efficiency and production costs of the solar cell, the solar cell can be divided into three generations in development thereof, the first generation solar cell mainly made of silicon wafers with an efficiency over 20% shows disadvantages of a higher production cost and difficultly refining the silicon wafers, which results in a second generation solar cell. The second generation solar cell is mainly made for reducing the silicon content or made of cheaper materials, e.g. Cadmium Antimonide (CdTe) and Copper Indium Selenide ($CuInSe_2$) or the like, with an efficiency identical to that of the first generation. The third generation solar cell is developed for two specific purposes, one for an high conversion efficiency and the other for reduction of production costs by creation of an appropriate efficiency ranging from 15% to 20%. In terms of the conversion efficiency enhancement, although the solar cell having a conversion efficiency up to 30% by use of the multi-layers of different semiconductor materials to absorb respectively sunlight of different wavelengths has been already developed, its high production cost is still an issued to be unresolved. On the other hand, using the organic materials to produce the third generation solar cell shows the advantages of lower production costs and simpler processes. Although the conversion efficiency of the solar cell is low, it has a very good potential in application and development thereof.

The biggest advantage of the organic solar cell is to use the solution process, such as spin coating and inkjet coating methods. In an existing technology, the single active layer is the simplest structure in production thereof. However, the efficiency of the organic solar cell having a single active layer is not outstanding. Further, bilayer or blended active layer is developed. Bilayer active layer is consisted of two separated materials. However, there is fewer interface between the donor and acceptor of the bilayer, the efficiency cannot be improved effectively. Therefore, a blended process is developed in the organic solar cell. The majority of existing structure of the organic solar cell is composed of bulk heterojunction (BHJ) manufactured by blended process, wherein active layer for absorbing light is used with conjugated polymer (P3HT) as the donor and phenyl-C61-butyric acid methyl ester (PCBM) as the acceptor to increase the number of interface between the donor and acceptor and to separate more electron-hole pair. Because of the power conversion efficiency (PCE) of the organic solar cell by the blended process is better than one with the bilayer, the organic solar cell with bilayer is ignored gradually. However, the phenomenon of the carrier break and dead end (dead island) are easily formed between the electron and hole of the organic solar cell manufactured by blended process, and it causes the increase of the series resistance and the decrease of the fill factor (FF), so that the electron cannot be successfully transferred to the cathode.

SUMMARY OF THE INVENTION

Therefore, in order to effectively increase the number of interface between the donor and acceptor, to enhance the transmission smoothness of the electron and hole, and to improve the parameter of the current density ($J_{sc}$) and fill factor (FF) of the active layer, a primary goal of the present invention is to provide an organic solar cell having a plurality of surface heterojunctions active layer and a method for manufacturing the same by forming and partially embedding a plurality of nanostructured particles as acceptors in a donor layer due to the hydrophobic phenomenon occurred among the donor layer and the nanostructured particle acceptors. In such as case, the interface between the donor and acceptor enables to be increased to transfer the electron and hole without obstacles for promoting the efficiency of the organic solar cell.

In order to achieve the above objectives, an active layer of an organic solar cell having a plurality of surface heterojunctions is present herein. The active layer of the organic solar cell having the surface heterojunctions comprises a donor layer and a plurality of acceptor particles partially embedded in a surface of the donor layer.

The donor layer is made of P3HT, PCDTBT, PSBTBT, PTBF, PCPDTBT or PBTTPD.

The acceptor particle is made of PCBM, ICMA or ICBA.

The acceptor particle has a length ranging from 80 nm to 120 nm.

The acceptor particle has a cross section of a circle, an ellipse, an ellipse-like shape or a combination thereof.

In addition, an organic solar cell having the surface heterojunctions active layer is also present herein. It comprises a glass substrate, a first electrode, a first transmission layer, an active layer, a second transmission layer and a second electrode. The first electrode is formed on the glass substrate. The first transmission layer is formed on the first electrode. The active layer is deposited on the first transmission layer. The second transmission layer is formed on the active layer. The second electrode is formed on the second transmission layer.

Furthermore, a method for manufacturing an organic solar cell having a plurality of surface heterojunctions active layer includes following steps as forming sequentially a first electrode and a first transmission layer on a glass substrate, filming a donor material dissolved in a first solvent on the first transmission layer to form a donor layer, spin coating an acceptor material dissolved in a second solvent on the donor layer, and then allowing the coating to stand on the donor layer for a while to form a plurality of acceptor particles on the donor layer, wherein these acceptor particles are partially embedded in a surface of the donor layer to form an active layer, and finally forming sequentially a second transmission layer and a second electrode on the active layer to finish an organic solar cell having a plurality of surface heterojunctions active layer.

The acceptor material dissolved in a second solvent on the donor layer is spin coated at a rotational speed ranging from 2000 rpm to 6000 rpm.

The first solvent is Dichlorobenzene (DCB).

The donor layer is made of P3HT, PCDTBT, PSBTBT, PTBF, PCPDTBT or PBTTPD.

The second solvent is Dichloromethane (DCM).

The acceptor material is made of PCBM, ICMA or ICBA.

The acceptor particle has a length ranging from 80 nm to 120 nm.

The acceptor particle has a cross section of a circle, an ellipse, an ellipse-like shape or a combination thereof.

Accordingly, a plurality of nanostructured particles are partially embedded in the surface of the donor layer due to the hydrophobic phenomenon occurred among the donor layer and the nanostructured particle acceptors. In such as case, the interface between the donor and acceptor enables to be increased to transfer the electron and hole without obstacles for promoting the efficiency of the organic solar cell. Furthermore, the acceptor material dissolved in the second solvent is spin-coated on the donor layer made of the donor material dissolved in the first solvent by the spin-coating method, when the faster the speed of the spin-coating is, the smaller the nanostructured acceptor particle cohesively formed on the donor layer is, and the more the number of the acceptor particle per unit area is, and the more the interface formed between the donor and acceptor is, and then the bigger the current density of the organic solar cell is. Compare to the active layer formed by the blending method, the current density has 30% improvement. Finally, the electron and hole are separated by the nanostructured acceptor particles partially embedded in the active layer, and the separated holes are transferred to the second transmission layer along the interfaces between the donors and acceptors, and then absorbed by the second electrode. The electron is transferred to the first electrode through the donor layer and the first transmission layer. The transferred mechanism allows that the transmission of electron and hole enables to be increased to transfer without obstacles, and the dead island phenomenon between the electron and the hole is not occurred, and then the recombination is occurred to effectively improve a fill factor up to about 25%, better than the blending type fill factor (FF), while the photoelectric conversion efficiency (PCE) has about 60% improvement, better than the blending type photoelectric conversion efficiency (PCE).

BRIEF DESCRIPTION OF THE DRAWINGS

The structure and the technical means adopted by the present invention to achieve the above and other objects can be best understood by referring to the following detailed description of the preferred embodiments and the accompanying drawing, wherein.

DETAILED DESCRIPTION OF THE PREFERRED EMBODIMENT

In the following embodiments, the description of a layer (or a film) or a structure deposited on or under another substrate, another layer (or film) or another structure should be well understood to include disposition of the layer (or the film) or the structure on or under the other substrate, layer (or film) or another structure in a direct manner, or in an indirect manner by use of more than one intermediate layers therebetween. Please refer to the location of each layer in brief description of the figures.

Figure 1:
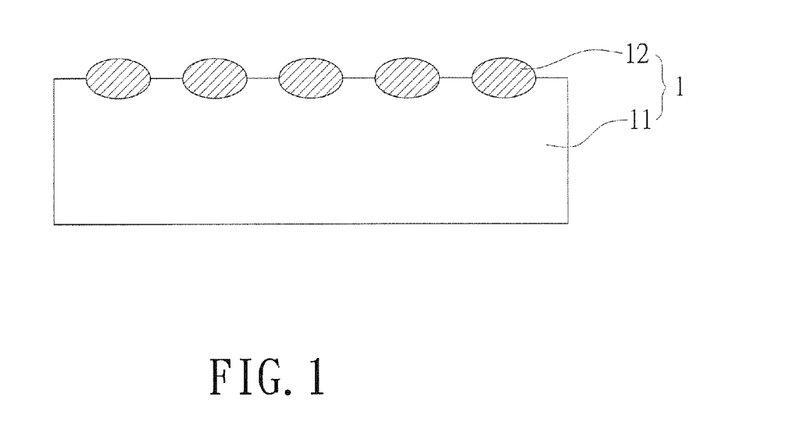
FIG. 1 is a schematic cross-sectional drawing showing the active layer structure of an embodiment to the present invention.
Figure 2:
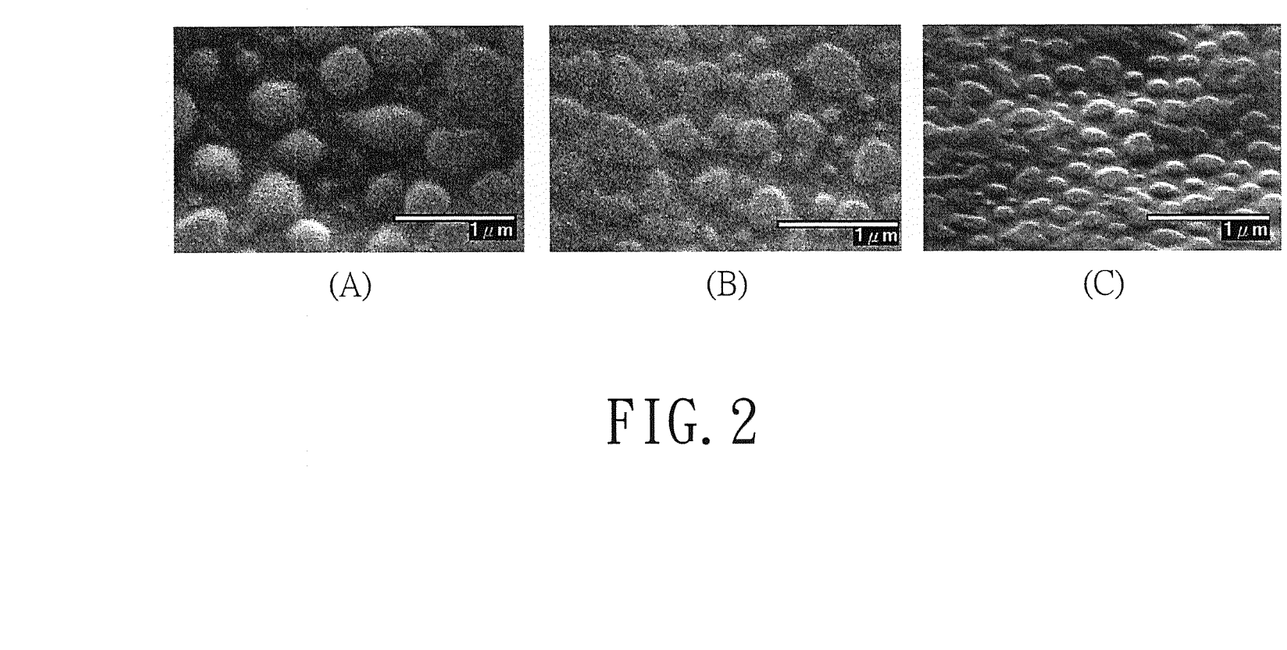
FIG. 2 is an electron microscope image of the active layer structure of an embodiment to the present invention.

As referring to FIG. 1 and FIG. 2, the schematic cross-sectional drawings and an electron microscope image showing an active layer structure of an embodiment to the present invention, wherein an active layer 1 of the organic solar cell having the surface heterojunctions comprises a donor layer 11 and a plurality of acceptor particles 12 partially embedded in the surface of the donor layer 11. In addition, the donor layer 11 is made of P3HT, PCDTBT, PSBTBT, PTBF, PCPDTBT or PBTTPD, and the acceptor particle 12 is made of PCBM, ICMA or ICBA. In the preferred embodiment of the present invention, the donor layer 11 is made of P3HT, and the acceptor particle 12 is made of PCBM. The acceptor particle 12 partially embedded in the surface of the donor layer 11 has a length ranging from 80 nm to 120 nm, and it has a cross section of a circle, an ellipse, an ellipse-like shape or a combination thereof.

Figure 3:
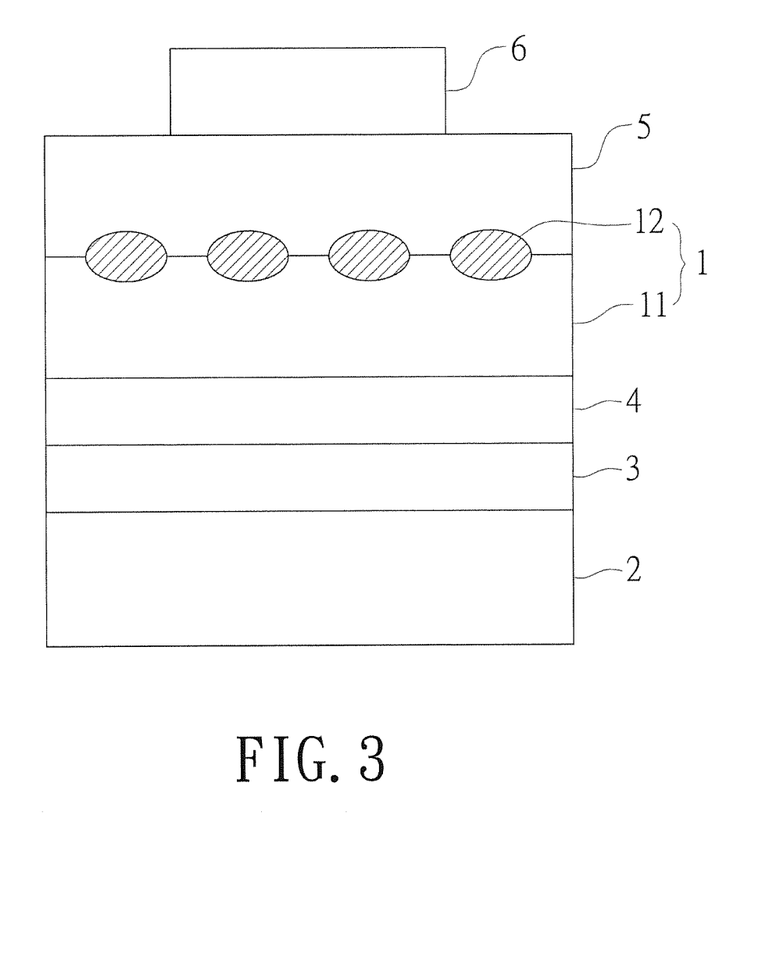
FIG. 3 is a schematic cross-sectional drawing showing the organic solar cell structure of an embodiment to the present invention.

In addition, as referring to FIG. 3, it is a schematic cross-sectional drawing for the organic solar cell structure of an embodiment to the present invention, comprising the active layer 1 having the surface heterojunctions, a glass substrate 2, a first electrode 3 formed on the glass substrate 2 and made of indium tin oxide (ITO) due to high transmittance and electrical conductivity thereof, a first transmission layer 4 formed on the first electrode 3, a second transmission layer 5 and a second electrode 6.

The active layer 1 is deposited on the first transmission layer 4, and it comprises a donor layer 11 and a plurality of acceptor particles 12 partially embedded in the surface of the donor layer 11.

The first electrode 3 can be sputtered on the glass substrate 2 or a substrate made of a soft material as a conductive anode.

A first preferred embodiment of the present invention takes a reverse organic solar cell for instance, and the first transmission layer 4 is made of zinc oxide (ZnO). The organic solar cell structure is constituted by a multilayer film, so the control of the energy gaps between these layers is very important. The first electrode 3 plays the role of the electron collection, but ITO is a metal oxide with high work function, it is against the electron transport in the structure. Therefore, the energy gap of the first transmission layer 4 of ZnO can match with the organic active layer 1 and the first electrode 3, and it also has a good electron transport capability. Furthermore, in a second preferred embodiment of the present invention, the first transmission layer 4 formed on the first electrode 3 is made of conductive polymer (PEDOT: PSS).

The second transmission layer 5 is formed on the active layer 1. In the preferred embodiment of the reverse organic solar cell of the present invention, the second transmission layer 5 is made of conductive polymer (PEDOT: PSS) as a hole transmission layer. It allows the holes separated from the active layer 1 to transfer to the anode of the first electrode 3 through the first transmission layer 4 and prevent the electrons transfer to the first electrode 3 to improve the performance of the battery. In addition, in the second embodiment of a forward organic solar cell structure of the present invention, the second transmission layer 5 is made of zinc oxide (ZnO).

The second electrode 6 is formed on the second transmission layer 5. In the preferred embodiment of the reverse organic solar cell structure of the present invention, the second electrode 6 is a positive electrode made from silver bullion heated and coated by a thermal evaporation coating equipment. Since the metal electrode has good stability in the atmosphere and less susceptible in the water oxygen, so that it can effectively improve device lifetime in the atmosphere and increase the convenience of the research. Furthermore, in the second embodiment of a forward organic solar cell structure of the present invention, the second electrode 6 made of Aluminum is formed on the second transmission layer 5.

Figure 4:
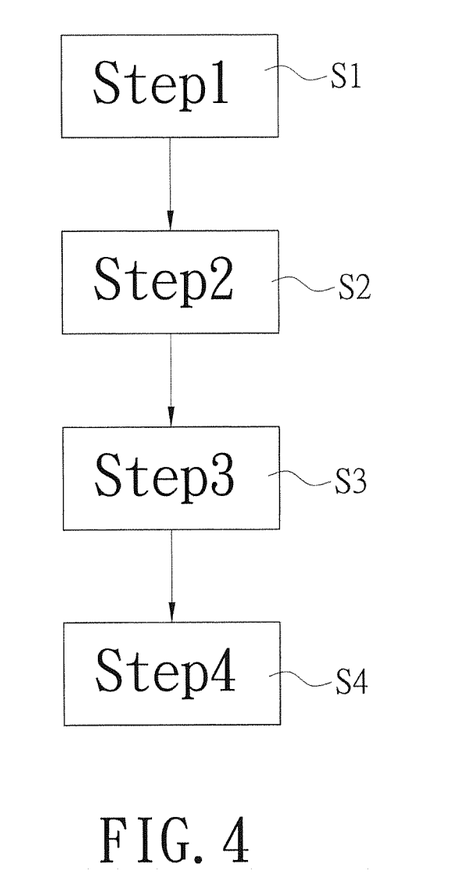
FIG. 4 is a flow chart showing steps of an embodiment of a method for manufacturing an organic solar cell having a plurality of surface heterojunctions active layer according to the present invention.

As referring to FIG. 4, the flow chart showing steps of an embodiment of a method for manufacturing an organic solar cell having a plurality of surface heterojunctions active layer according to the present invention, the method for manufacturing the organic solar cell having the surface heterojunctions active layer includes following steps.

Step one (S1): a first electrode 3 and a first transmission layer 4 is sequentially formed on a glass substrate 2.

Step two (S2): a donor material dissolved in a first solvent is filmed on the first transmission layer 4 to form a donor layer 11. In addition, the donor layer is made of P3HT, PCDTBT, PSBTBT, PTBF, PCPDTBT or PBTTPD. In the preferred embodiment of the present invention, filming a donor material of P3HT dissolved in Dichlorobenzene (DCB) on the first transmission layer 4 to form a donor layer 11.

Step three (S3): an acceptor material dissolved in a second solvent is coated on the donor layer 11, and then allowing the coating to stand on the donor layer 11 for a while to form a plurality of acceptor particles 12 forming on the donor layer 11, wherein these acceptor particles 12 are partially embedded in the surface of the donor layer 11 to form an active layer 1. In addition, the acceptor material is made of PCBM, ICMA or ICBA. In the preferred embodiment of the present invention, coating an acceptor material of PCBM dissolved in a second solvent of Dichloromethane (DCM) on the donor layer 11 includes spin coating at a rotational speed ranging from 2000 rpm to 6000 rpm. After standing for 5 to 10 seconds, due to the hydrophobic phenomenon occurred among the first solvent and second solvent, a plurality of acceptor particles 12 partially embedded in the surface of the donor layer 11, and not a film. As referring to FIG. 1 and FIG. 2 again, a plurality of acceptor particles 12 are partially embedded in the surface of the donor layer 11, that is, a half of the acceptor particle is embedded in the surface of the donor layer 11, and the other half is protruded in the outside of the donor layer 11. The acceptor particle 12 has a length ranging from 80 nm to 120 nm, and has a cross section of a circle, an ellipse, an ellipse-like shape or a combination thereof.

Step four (S4): a second transmission layer 5 and a second electrode 6 is sequentially formed on the active layer 1.

In addition, since the structure of the active layer of the present invention is different from the traditional blending form of the organic solar cell with the bulk heterojunction (BHJ), it uses planar type to form the bulk heterojunction (BHJ). The solar cell formed by the active layer 1 is called surface heterojunctions OPV. Since the interfaces between the donors and acceptors causes the separation of the electron and hole, the separated electron and hole are transferred respectively to the cathode and anode, so that a voltage difference is generated respectively in the electrodes and a power is generated. As referring to FIG. 5, the voltage and current density diagram of an embodiment of a reverse organic solar cell according to the present invention, wherein the segment of "PCBM embedded" is expressed as the organic solar cell manufactured by the thin film stack, that is, the acceptor layer of PCBM exists in the middle of both donor layers 11 of P3HT, and the acceptor layer is a layer, not the acceptor particle 12 of the present invention. The segment of "PCBM 2000 rpm" is expressed as the acceptor material dissolved in the second solvent is spin coated on the donor layers 11 at a rotational speed of 2000 rpm, and the segment of "PCBM 4000 rpm" is expressed as the acceptor material dissolved in the second solvent is spin coated on the donor layers 11 at a rotational speed of 4000 rpm, and the segment of "PCBM 6000 rpm" is expressed as the acceptor material dissolved in the second solvent is spin coated on the donor layers 11 at a rotational speed of 6000 rpm. Finally, the segment of "blended" is expressed as the organic solar cell manufactured by the blended process. The horizontal axis represents the voltage and the vertical axis represents the current density, in which $V_{oc}$ is voltage, $J_{sc}$ is current density, FF is fill factor, and PCE is device efficiency. When the faster the rotational speed of the acceptor material of PCBM dissolved in the second solvent of Dichloromethane (DCM) spin coated on the donor layers 11 is, the smaller the cohesive acceptor particle of PCBM formed on the donor layer 11 of P3HT is, and more the number of the nanostructured particle per unit area is, so the number of the interface between the donor and acceptor of the smaller nanostructured particle of PCBM is more than one of the bigger nanostructured particle of PCBM, and the bigger the current density of the organic solar cell is. From the figure showing, the current density ($J_{sc}$) of the reverse organic solar cell is improved from 7.98 mA/cm² of the blended active layer to 10.15 mA/cm². This is because that the formation of the acceptor particle 12 of PCBM causes the separation of the electron and hole, the hole is transferred along the interfaces between the donor and acceptor to the second transmission layer 5 of PEDOT, and then is absorbed by the second electrode 6. The electron is absorbed by the first electrode 3 of ITO through the donor layer 11 and the first transmission layer 4 of ZnO. The transferred mechanism allows that the transmission of electron and hole enables to be increased to transfer without obstacles, and the dead island phenomenon between the electron and the hole is not occurred, and then the recombination is occurred to effectively improve the fill factor (FF) from 0.59 to 0.73, thus the fill factor (FF) has about 25% improvement, better than the blending type fill factor (FF). The photoelectric conversion efficiency (PCE) is increased from 2.8% to 4.38%, thus the photoelectric conversion efficiency (PCE) has about 60% improvement, better than the blending type photoelectric conversion efficiency (PCE).

Figure 5:
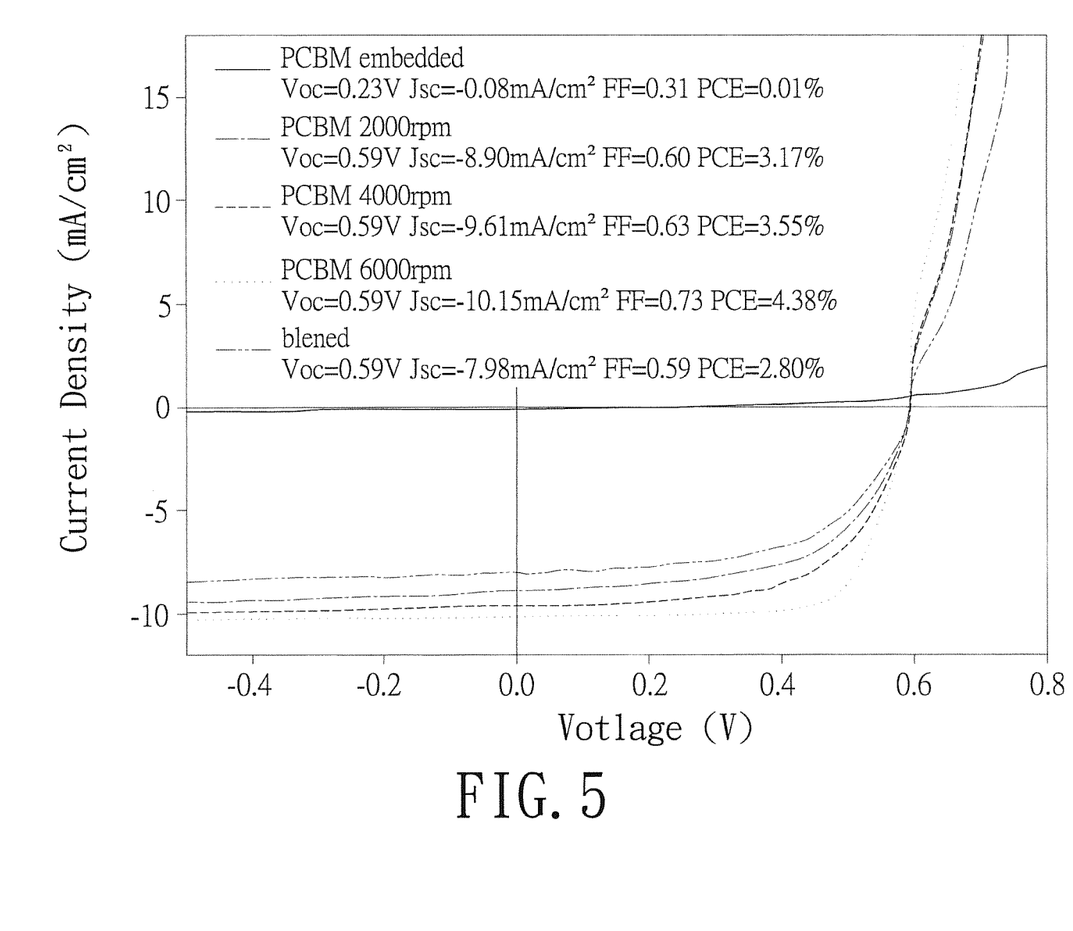
FIG. 5 is a voltage and current density diagram of an embodiment of a reverse organic solar cell according to the present invention.
Figure 6:
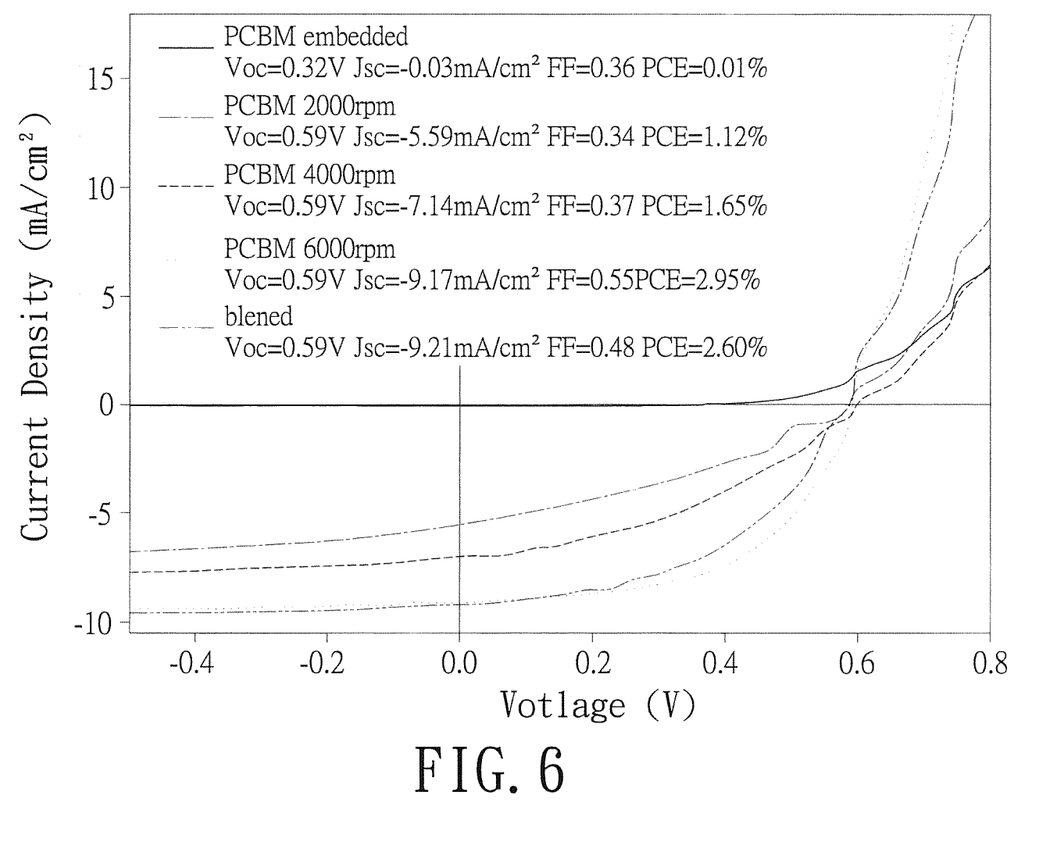
FIG. 6 is a voltage and current density diagram of second embodiment of a forward organic solar cell according to the present invention.

As referring to FIG. 6, the voltage and current density diagram of second embodiment of a forward organic solar cell according to the present invention, same as the above FIG. 5, wherein the segment of "PCBM embedded" is also expressed as the organic solar cell manufactured by the thin film stack, the segment of "PCBM 2000 rpm" is expressed as the acceptor material dissolved in the second solvent is spin coated on the donor layers 11 at a rotational speed of 2000 rpm, the segment of "PCBM 4000 rpm" is expressed as the acceptor material dissolved in the second solvent is spin coated on the donor layers 11 at a rotational speed of 4000 rpm, and the segment of "PCBM 6000 rpm" is expressed as the acceptor material dissolved in the second solvent is spin coated on the donor layers 11 at a rotational speed of 6000 rpm. Finally, the segment of "blended" is expressed as the organic solar cell manufactured by the blended process. The horizontal axis represents the voltage and the vertical axis represents the current density, in which $V_{oc}$ is voltage, $J_{sc}$ is current density, FF is fill factor, and PCE is device efficiency. From the figure showing, the fill factor (FF) and the current density ($J_{sc}$) of the forward organic solar cell has 15% improvement rate.

Compared with techniques available now, the present invention has the following advantages:
1. A plurality of nanostructured particles are partially embedded in a surface of the donor layer due to the hydrophobic phenomenon occurred among the donor layer and the nanostructured particle acceptors. In such as case, the interface between the donor and acceptor enables to be increased to transfer the electron and hole without obstacles for promoting the efficiency of the organic solar cell.
2. The acceptor material dissolved in the second solvent is spin-coated on the donor layer made of the donor material dissolved in the first solvent by the spin-coating method, when the faster the speed of the spin-coating is, the smaller the nanostructured acceptor particle cohesively formed on the donor layer is, and the more the number of the acceptor particle per unit area is, and the more the interface formed between the donor and acceptor is, and then the bigger the current density of the organic solar cell is. Compare to the active layer formed by the blending method, the current density has 30% improvement.
3. The electron and hole are separated by the nanostructured acceptor particles partially embedded in the active layer, and the separated holes are transferred to the second transmission layer along the interfaces between the donors and acceptors, and then absorbed by the second electrode. The electron is transferred to the first electrode through the donor layer and the first transmission layer. The transferred mechanism allows that the transmission of electron and hole enables to be increased to transfer without obstacles, and the dead island phenomenon between the electron and the hole is not occurred, and then the recombination is occurred to effectively improve a fill factor up to about 25%, better than the blending type fill factor (FF), while the photoelectric conversion efficiency (PCE) has about 60% improvement, better than the blending type photoelectric conversion efficiency (PCE).

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:
1. An organic solar cell, comprising:
   a glass substrate;
   a first electrode formed on the glass substrate;
   a first transmission layer formed on the first electrode;
   an active layer having a plurality of surface heterojunctions, and the active layer is deposited on the first transmission layer, wherein the active layer comprises:
      a donor layer, made of poly(3-hexylthiophene) (P3HT), poly[N-9'-heptadecanyl-2,7-carbazole-alt-5,5-(4',7'-di-2-thienyl-2',1',3'-benzothiadiazole)] (PCDTBT), poly[(4,4'-bis(2-ethylhexyl) dithieno[3,2-b:2',3'-d]silole)-2,6-diyl-alt-(4,7-bis(2-thienyl)-2,1,3-benzo thiadiazole)-4,7-diyl] (PSBTBT), fluorinated polythienothiophene-co-benzodithiophenes (PTBF), poly[2,6-(4,4-bis-(2-ethylhexyl)-4H-cyclopenta[2,1-b;3,4-b']-di-thiophene)-alt-4,7(2,1,3-benzothiadiazole)] (PCPDTBT) or poly-{bi(dodecyl) thiophene-thieno[3,4-c]pyrrole-4,6-dione} (PBTTPD); and
      a plurality of acceptor particles, wherein each of the acceptor particles is partially embedded in a surface of the donor layer, such that one of the surface heterojunctions is formed at an interface between the donor layer and the each of the acceptor particles partially embedded in the donor layer, wherein a portion of the each of the acceptor particles is embedded in the surface of the donor layer, and the other portion of the each of the acceptor particles is protruded in an outside of the donor layer;
   a second transmission layer formed on the donor layer and the other portion of the each of the acceptor particles protruded from the surface of the donor layer, wherein the second transmission layer is made of PEDOT: PSS or zinc oxide; and
   a second electrode formed on the second transmission layer.

2. A method for manufacturing an organic solar cell having a plurality of surface heterojunctions active layer comprising the steps of:
   step one: forming sequentially a first electrode and a first transmission layer on a glass substrate;
   step two: filming a donor material dissolved in a first solvent on the first transmission layer to form a donor layer, wherein the donor layer is made of poly(3-hexylthiophene) (P3HT), poly[N-9'-heptadecanyl-2,7-carbazole-alt-5,5-(4',7'-di-2-thienyl-2',1',3'-benzothia diazole)] (PCDTBT), poly[(4,4'-bis(2-ethylhexyl)dithieno [3,2-b:2',3'-d] silole)-2,6-diyl-alt-(4,7-bis(2-thienyl)-2,1,3-benzothia diazole)-4,7-diyl] (PSBTBT), fluorinated polythienothiophene-co-benzodithiophenes (PTBF), poly[2,6-(4,4-bis-(2-ethylhexyl)-4H-cyclopenta[2,1-b;3,4-b']-di-thiophene)-alt-4,7(2,1,3-benzothiadiazole)] (PCPDTBT) or poly-{bi(dodecyl)thiophene-thieno[3,4-c]pyrrole-4,6-dione} (PBTTPD);

step three: spin coating an acceptor material dissolved in a second solvent on the donor layer, and allowing the coating to stand on the donor layer for a while to form a plurality of acceptor particles on the donor layer, wherein these acceptor particles are partially embedded in a surface of the donor layer to form an active layer; and step four: forming sequentially a second transmission layer and a second electrode on the active layer, wherein the second transmission layer is made of PEDOT: PSS or zinc oxide, and the second transmission layer is formed on the donor layer and a protruded portion of each of the acceptor particles protruded from the surface of the donor layer.

3. The method as claimed in claim 2, wherein an acceptor material dissolved in a second solvent is spin coated on the donor layer at a rotational speed ranging from 2000 rpm to 6000 rpm.

4. The method as claimed in claim 2, wherein the first solvent is Dichlorobenzene (DCB).

5. The method as claimed in claim 2, wherein the second solvent is Dichloromethane (DCM).

6. The method as claimed in claim 2, wherein the acceptor particles are made of (6,6)-phenyl C61-butyric acid methyl ester (PCBM), indene-C60 monoadduct (ICMA) or indene-C60 bisadduct (ICBA).

7. The method as claimed in claim 2, wherein the acceptor particles have a length ranging from 80 nm to 120 nm.

8. The method as claimed in claim 2, wherein the acceptor particles have a cross section of a circle, an ellipse or a combination thereof.

9. The organic solar cell as claimed in claim 1, wherein the acceptor particles are made of (6,6)-phenyl C61-butyric acid methyl ester (PCBM), indene-C60 monoadduct (ICMA) or indene-C60 bisadduct (ICBA).

10. The organic solar cell as claimed in claim 1, wherein the acceptor particles have a length ranging from 80 nm to 120 nm.

11. The organic solar cell as claimed in claim 1, wherein the acceptor particles have a cross section of a circle, an ellipse or a combination thereof.

* * * * *